United States Patent
Blanding (10) Patent No.: US 8,950,468 B2
(45) Date of Patent: Feb. 10, 2015

(54) COOLING SYSTEM FOR AEROSPACE VEHICLE COMPONENTS

(75) Inventor: David E. Blanding, Hawthorne, CA (US)

(73) Assignee: The Boeing Company, Chicago, IL (US)

(*) Notice: Subject to any disclaimer, the term of this patent is extended or adjusted under 35 U.S.C. 154(b) by 1604 days.

(21) Appl. No.: 11/747,467

(22) Filed: May 11, 2007

(65) Prior Publication Data
US 2010/0132915 A1 Jun. 3, 2010

(51) Int. Cl.
*F28F 3/12* (2006.01)
*F28F 1/32* (2006.01)
*B64D 13/00* (2006.01)
*B64D 13/06* (2006.01)

(52) U.S. Cl.
CPC .............. *B64D 13/006* (2013.01); *Y02T 50/44* (2013.01); *B64D 2013/0614* (2013.01)
USPC .......................................... 165/168; 165/171

(58) Field of Classification Search
CPC .................... B64D 13/006; B64D 2013/0614; Y02T 50/44
USPC .................................. 165/168, 171
See application file for complete search history.

(56) References Cited

U.S. PATENT DOCUMENTS

| | | | | |
|---|---|---|---|---|
| 3,702,632 A * | 11/1972 | Grimshaw | ..................... | 165/152 |
| 4,136,428 A * | 1/1979 | Godsey et al. | ........... | 29/890.045 |
| 4,142,511 A * | 3/1979 | Doughty et al. | .............. | 126/654 |
| 5,263,538 A * | 11/1993 | Amidieu et al. | .............. | 165/168 |
| 5,769,158 A * | 6/1998 | Yao | .................................. | 165/185 |
| 5,962,348 A * | 10/1999 | Bootle et al. | ................... | 442/265 |
| 5,975,201 A * | 11/1999 | Roberts et al. | ................ | 165/185 |
| 6,284,206 B1 * | 9/2001 | Lesieur et al. | ................ | 422/198 |
| 6,942,018 B2 * | 9/2005 | Goodson et al. | ............. | 165/80.4 |
| 7,070,755 B2 * | 7/2006 | Klett et al. | ..................... | 423/448 |
| 7,168,484 B2 * | 1/2007 | Zhang et al. | ................... | 165/185 |
| 7,303,820 B2 * | 12/2007 | Capp et al. | ..................... | 428/408 |
| 7,926,557 B2 * | 4/2011 | Huebner et al. | .............. | 165/170 |
| 2002/0166660 A1 * | 11/2002 | Norley et al. | .................. | 165/905 |
| 2003/0230399 A1 * | 12/2003 | Hurlbert et al. | .......... | 165/104.25 |
| 2005/0006083 A1 * | 1/2005 | Chen et al. | ..................... | 165/185 |
| 2005/0045317 A1 * | 3/2005 | Huebner et al. | .............. | 165/170 |
| 2005/0061496 A1 * | 3/2005 | Matabayas | ..................... | 165/185 |
| 2005/0126766 A1 * | 6/2005 | Lee et al. | ....................... | 165/133 |
| 2007/0289730 A1 * | 12/2007 | Wu | ............................... | 165/185 |

FOREIGN PATENT DOCUMENTS

WO PCT/US2008/062439    5/2008

OTHER PUBLICATIONS

Don Wood, "Paper Promise" Research in Review Magazine, Florida State University, Spring 2006.

* cited by examiner

*Primary Examiner* — Brandon M Rosati
(74) *Attorney, Agent, or Firm* — Parsons Behle & Latimer (57) ABSTRACT

A cooling system for removing heat generated by electrical components onboard aerospace vehicles flows coolant between an evaporator that removes heat from the component, and a condenser within the skin of the vehicle. The skin is formed from facesheets comprising multiple layers of polymer resin reinforced with meshes of single and double wall nanotubes. The nanotubes conduct the heat directionally so as to both distribute the heat over the skin and direct the heat to the outer surface of the skin where the heat can be carried away by air flowing over the skin. The skin may also include conductive carbon foam surrounding the condenser to reduce thermal resistance between the condenser and the facesheets.

18 Claims, 7 Drawing Sheets

FIG. 17

COOLING SYSTEM FOR AEROSPACE VEHICLE COMPONENTS

TECHNICAL FIELD

This disclosure generally relates to systems for removing heat generated by electrically powered subsystems and components such as electronic devices onboard an aerospace vehicle, and deals more particularly with a cooling system integrated into the structure of the vehicle, such as the skin of an aircraft or spacecraft.

BACKGROUND

The increasing use of avionics and electrically powered subsystems onboard commercial and military aircraft requires improved thermal management of the heat loads produced by these electrical components. Current solutions to the problem of thermal management may be achieved at the expense of higher costs, possible reduction of overall component performance, decreased efficiency and/or increased weight. Effective management of thermal loads is made more difficult by the trend toward the use of outer skins formed from non-metallic materials in order to reduce weight. Commonly used structural composites typically have poor thermal conductivity, compared to metal skins. In the case of certain military aircraft, the need to maintain exterior surfaces smooth with a minimum number of penetrations to achieve radio frequency stealth may further reduce the design options for managing thermal loads.

Accordingly, there is a need for an improved cooling system for controlling heat loads generated by electrical components onboard aerospace vehicles. The illustrated embodiments of the disclosure are intended to satisfy this need.

SUMMARY

Embodiments of the disclosure transfer heat generated by onboard electrical components to areas on the aircraft where the heat can be released or dissipated. A cooling system for removing the heat may be integrated into a skin on the aircraft, such as a wing skin. Layers of resin reinforced with unidirectional carbon nanotubes allow the heat to be conducted through the thickness of the skin and then spread over the skin surface in order to improve thermal transfer efficiency.

According to one embodiment, a composite skin for aircraft is provided, comprising a thermal distribution system for distributing heat from a heat source laterally through the plane of the skin, and first and second facesheets on opposite sides of the thermal distribution system. At least one of the facesheets is thermally conductive for conducting heat from the distribution system to the face of the skin. The facesheet includes a first layer of material for conducting heat laterally through the plane of the facesheet, and a second layer of material contacting the first layer for conducting heat transversely through the plane of the facesheet. The first and second layers are bonded by a thermally conductive adhesive. The facesheet may include a third layer of material contacting the second layer for conducting heat laterally through the plane of the facesheet. The first layer of material may include a mesh of carbon nanotubes aligned in one direction and held in a synthetic resin matrix. The second layer of material may include a mesh of double wall carbon nanotubes aligned in a direction transverse to the plane of the first layer and held in a synthetic resin matrix. The thermal distribution system may include a heat transfer fluid and a serpentine heat exchanger between the first and second facesheets through which the heat transfer fluid may flow.

According to another embodiment, a system is provided for controlling heat generated by electronic components onboard a winged aircraft. The system comprises a cooling system for absorbing heat from an electronic component and transferring the absorbed heat to a wing on the aircraft, and a thermally conductive skin on the wing connected with the cooling system for transferring the absorbed heat to air flowing over the wing. The cooling system may include first and second heat exchangers respectively thermally coupled with the electronic component and the conductive skin. A heat transfer medium flowing between the first and second heat exchangers conveys the absorbed heat to the wing. The first heat exchanger may include an evaporator for vaporizing the heat transfer medium, and the second heat exchanger may include a condenser for condensing the heat transfer medium.

According to still another embodiment, a thermally conductive facesheet is provided for use in the skin of an aircraft. The facesheet comprises a first layer of thermally conductive material for conducting heat in a first direction laterally through the skin, and a second layer of thermally conductive material contacting the first layer for conducting heat in a second direction transverse to the first direction. The facesheet may further comprise a third layer of thermally conductive material contacting the second layer for conducting heat in a third direction laterally through the skin. The first layer may include a mesh of carbon nanotubes aligned in the first direction and held in a synthetic resin matrix. The second layer may include a mesh of double wall carbon nanotubes aligned in the second direction and held in a synthetic matrix. The third layer may include a synthetic resin reinforced with single wall nanotubes aligned in the third direction.

According to a method embodiment of the disclosure, a method is provided of cooling an electronic component onboard an aircraft. The method comprises the steps of: transferring heat from an electronic component to a coolant; flowing the coolant through at least a section of a wing on the aircraft; and, transferring heat in the coolant to a surface of the wing. Heat may be transferred from the electronic component to the coolant by evaporating the coolant to absorb heat from the electronic component. The flow of coolant may be distributed through the wing by passing the coolant through a serpentine coil. Heat in the coolant is transferred to a surface of the wing by condensing the coolant to release the heat contained in the coolant. The heat may be transferred from the coolant to the wing surface by spreading the heat across a first layer of material, conducting the heat from the first layer to a second layer, and spreading the heat across the second layer. The heat may be spread across the first and second layers by conducting heat through carbon nanotubes.

Other features, benefits and advantages of the disclosed embodiments will become apparent from the following description of embodiments, when viewed in accordance with the attached drawings and appended claims.

BRIEF DESCRIPTION OF THE ILLUSTRATIONS

DETAILED DESCRIPTION

The embodiments of the disclosure described below relate to a cooling system and components thereof for removing and/or distributing heated generated by one or more components or subsystems onboard an aircraft. It should be noted however, that the cooling system may be advantageously used on a variety of aerospace vehicles, including space vehicles and satellites. Referring FIGS. 1-5, a wing box for an aircraft includes upper and lower skins 22, 24 (FIG. 1) connected together by longitudinally extending spars 21. A heat generating component in the form an electric actuator motor 28 is mounted inside the wing box 20. Motor 28 displaces a shaft 30 through a drive mechanism in order to move a wing flap support 32. The heat generated by motor 28 within the enclosed space of the wing box 20 may reduce the performance and/or service life of the motor, and/or create undesirable "hot spots" in the wing that may be detected using infrared sensing techniques. The actuator motor 28 is merely illustrative of a wide variety of electrical and electronic components and subsystems that may generate heat onboard the aircraft.

Figure 3:
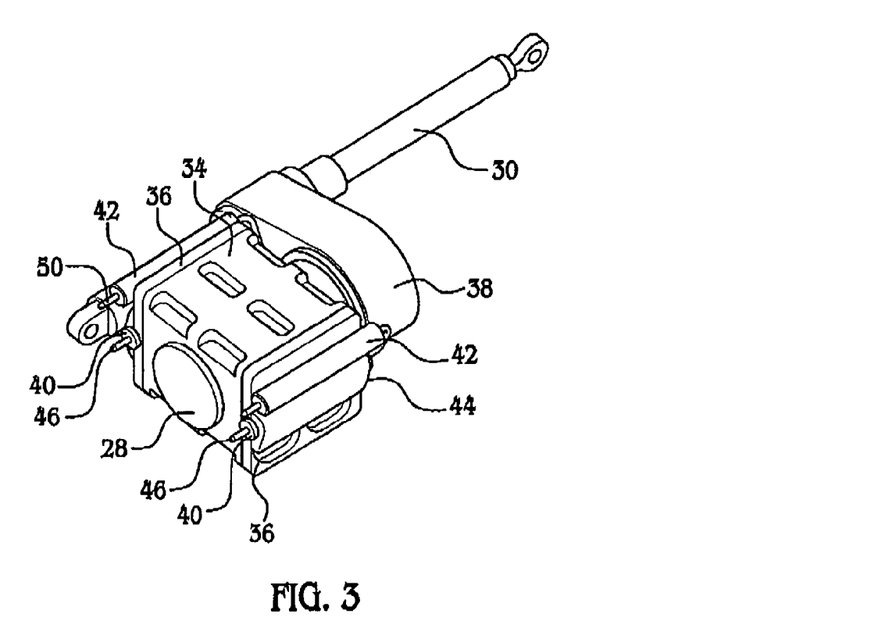
FIG. 3 is a perspective illustration of the actuator motor shown in FIGS. 1 and 2, better illustrating a thermal enclosure clamped around the actuator motor.
Figure 4:
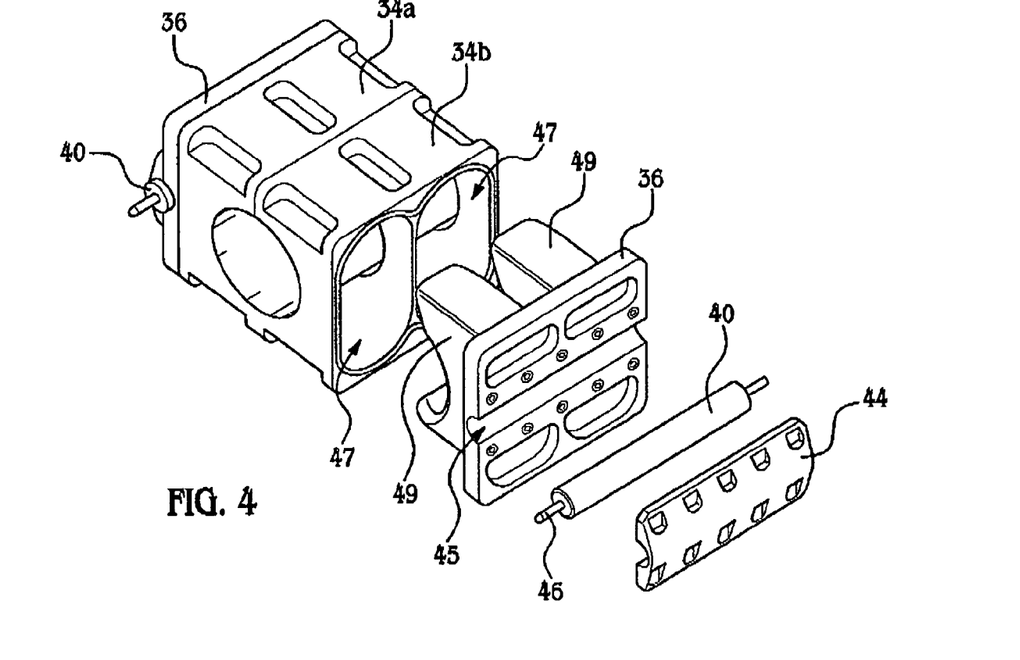
FIG. 4 is an exploded, perspective illustration of the thermal enclosure, including an evaporator tube.

As best seen in FIGS. 3 and 4, a thermal enclosure 34 includes two halves 34a, 34b that are bolted together so as to clamp enclosure 34 around the actuator motor 28. The thermal enclosure 34 is formed of a thermally non-conductive, lightweight material such as carbon fiber reinforced epoxy or other composite material. Each of the enclosure halves 34a, 34b includes a pair of cavities 47 for respectively receiving heat sinks 49 formed of thermally conductive material, such as a graphite carbon foam. The heat sinks 49 include curved surface areas for complementarily engaging the cylindrical body of the motor 28, and are secured to an enclosure cover 36.

The enclosure covers 36 are secured to the respective enclosure halves 34a, 34b using removable fasteners. The enclosure covers 36 are formed of a thermally conductive material such as aluminum and include an integrally formed outer pocket 45 for receiving a cylindrically shaped evaporator tube 40. Alternatively, the evaporator tubes 40 may be formed integral with the enclosure covers 36. The carbon foam inserts 49 may be filled with a phase change material to promote the conduction of heat from the motor 28 to the evaporator tube 40. A clamp member 44 is bolted to the enclosure cover 36 and tightly clamps the evaporator tube 40 in the pocket 45. Although not shown in the drawings, a mechanical lock may be provided between the enclosure 34 and the motor 28 to prevent relative rotation therebetween.

Figure 1:
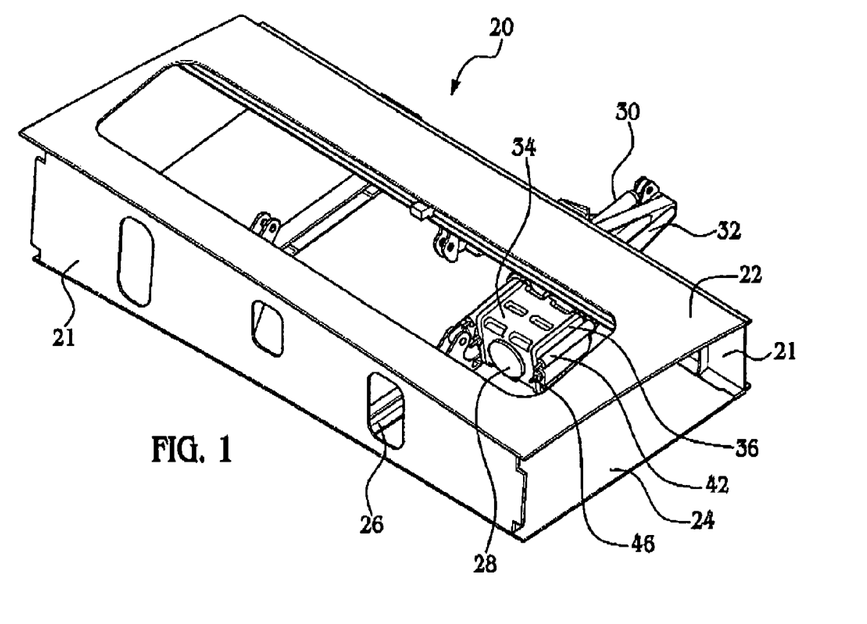
FIG. 1 is a perspective illustration of a wing box having an internal actuator motor, and showing part of the cooling system forming an embodiment of the disclosure.
Figure 2:
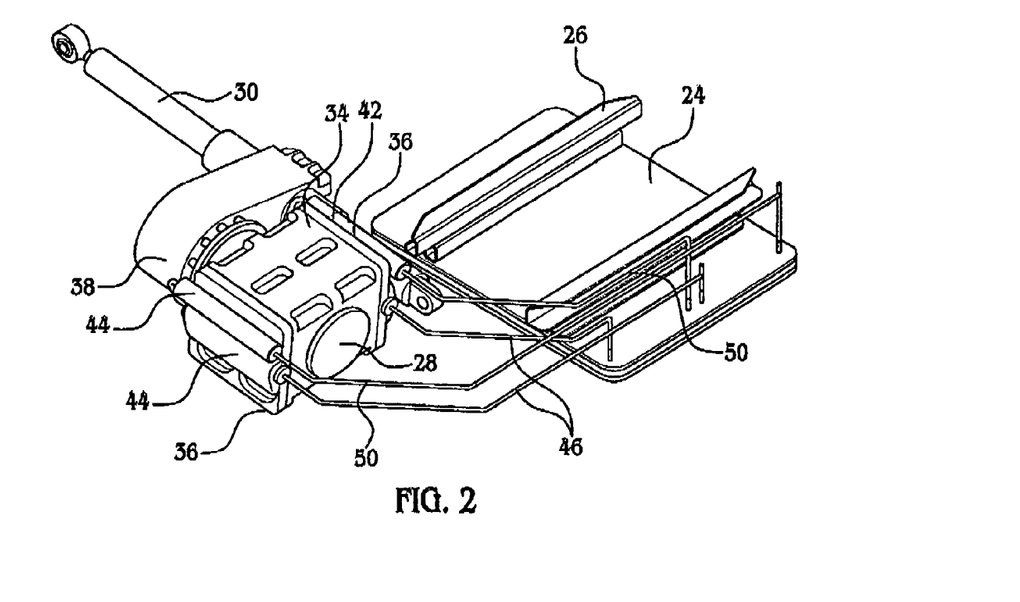
FIG. 2 is a perspective illustration of the actuator motor removed from the wing box and showing the fluid connections to the lower wing skin.

As best seen in FIGS. 1 and 3, a cylindrically shaped compensation chamber 42 is also secured to each of the covers 36. The evaporator tube 40 and the compensation chamber 42 are connected by fluid lines 46, 50 in the cooling loop shown in FIG. 5. Heat 64 passes from the motor 28 through the inserts 49 and the enclosure covers 36 to the walls of the evaporator tube 40. The heat then passes through a cylindrical wick 62 and is absorbed by a coolant fluid 58 which may be a two phase, heat transfer fluid such as ammonia, Freon®, water or methanol.

Figure 5:
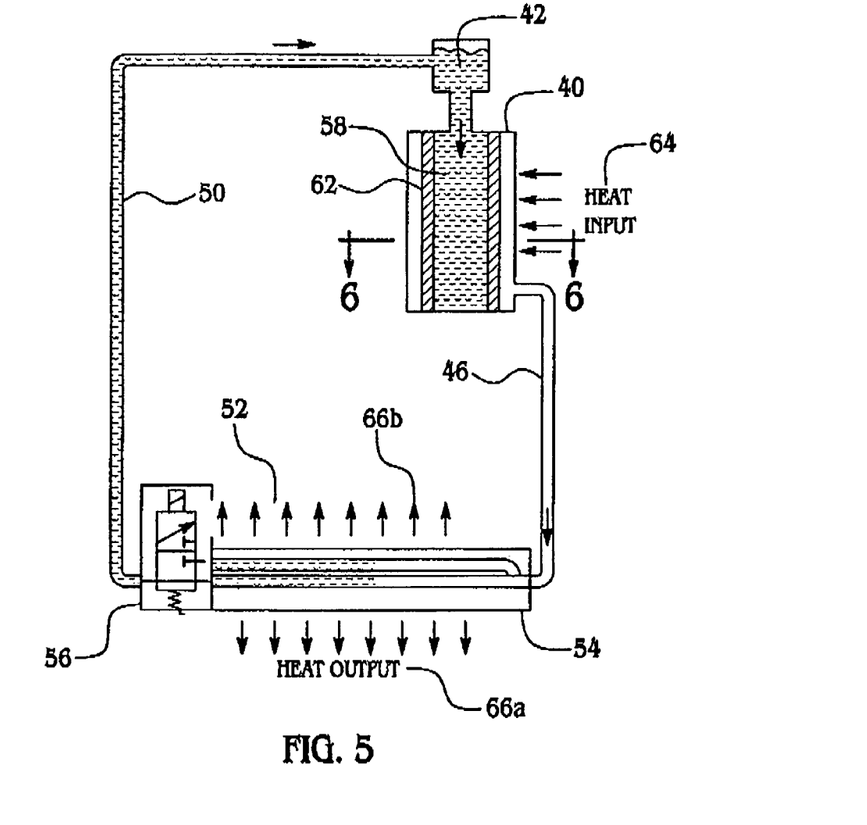
FIG. 5 is a schematic illustration of the cooling system loop.
Figure 6:
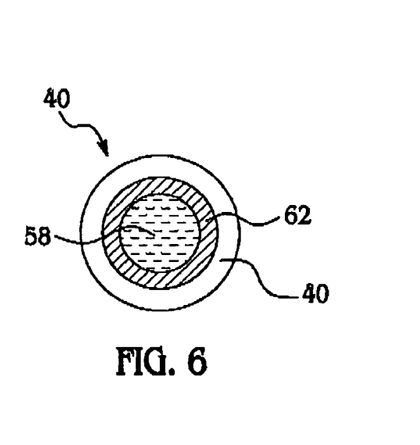
FIG. 6 is a sectional illustration taken along the line 6-6 in FIG. 5.
Figure 7:
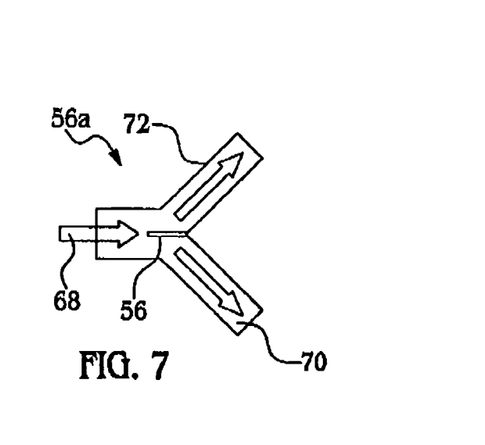
FIG. 7 is a diagrammatic illustration of an alternate form of a valve that may be used in the cooling system loop shown in FIG. 5.

The coolant fluid 58 evaporates as it absorbs the heat 64 to produce a hot vapor that is drawn through line 46 to a later discussed condenser 54. Condenser 54 includes condenser coils 52 where the coolant fluid is cooled and condensed into a liquid. During the phase change from a hot vapor to a liquid, heat is output at 66a or 66b from the condenser coils 52. The condensed liquid coolant passes through directional control valve 56 which allows the coolant flow to transfer heat into an upper or lower condenser coil 52. The directional control valve 56 may comprise, for example, a single coil, piloting solenoid valve. Alternatively, as shown in FIG. 7, the expansion valve 56 may comprise a two way nanoflap-valve 56a in which incoming fluid 68 is routed to either of two exit channels 70, 72 by a micro-flap 56.

The cooled vapor exits the directional control valve 56 and is delivered by line 50 to the compensation chamber 42 which acts as a buffer-like reservoir. The vapor then passes back into the evaporator 40 where further heat 64 is absorbed, thus completing the cooling cycle.

The condenser coils 52 are positioned inside one or both of the skins 22, 24. In the illustrated example, the condenser coils 52 are sandwiched between multiple layers of material which will be described in more detail below. Referring now to FIGS. 8-11, one embodiment of a skin 24a comprises multiple layers of material which not only provide a lightweight, strong skin covering, but function to transfer and release the heat generated by the actuator motor 28 over a relatively broad area of the skin 24a. It should be noted here that while the skin 24a illustrated in the present disclosure is a wing skins, the principles of the disclosed embodiments may be advantageously used in skins covering other surfaces of the aircraft, including the fuselage.

Figure 8:
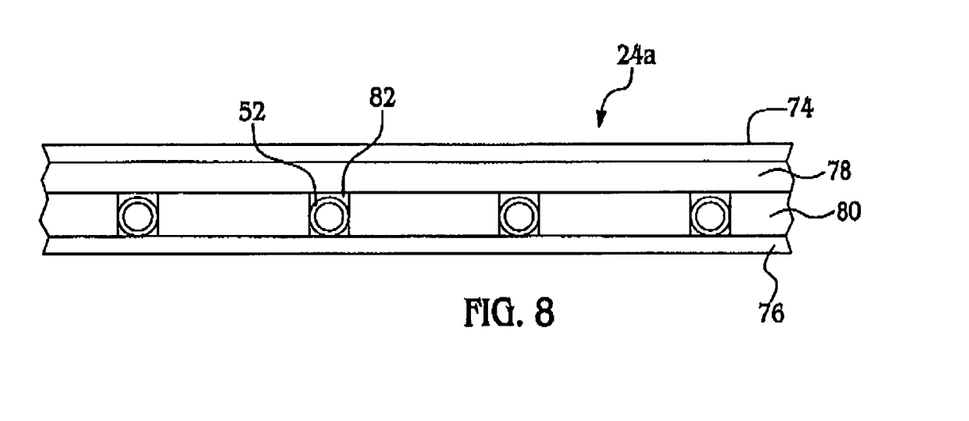
FIG. 8 is a sectional illustration of a wing skin forming one embodiment.

The wing skin 24a broadly comprises inboard and outboard facesheets 74, 76, a structural core 78 and one or more condenser coils 52 disposed within a layer 80 of thermally conductive material, such as carbon foam. One suitable foam that may be used as the layer 80 is disclosed in U.S. Pat. No. 7,070,755, issued Jul. 4, 2006 to Klett et al. The thermally conductive foam disclosed in Klett et al normally has a thermal conductivity of at least 40 W/mK, and has a specific thermal conductivity, defined as the thermal conductivity divided by the density, of at least about 75 W cm³/m° Kgm. This foam may also have a high specific surface area, typically at least about 6,000 m²/m³. The foam is characterized by an x-ray diffraction pattern having "doublet" 100 and 101 peaks characterized by a relative peak split factor no greater than about 0.470. The foam is graphitic and exhibits substantially isotropic thermal conductivity. The foam comprises substantially ellipsoidal pores and the mean pore diameter of such pores is preferably no greater than about 340 microns. Other materials, such as phase change materials, can be impregnated in the pores in order to impart beneficial thermal properties to the foam.

Figure 11:
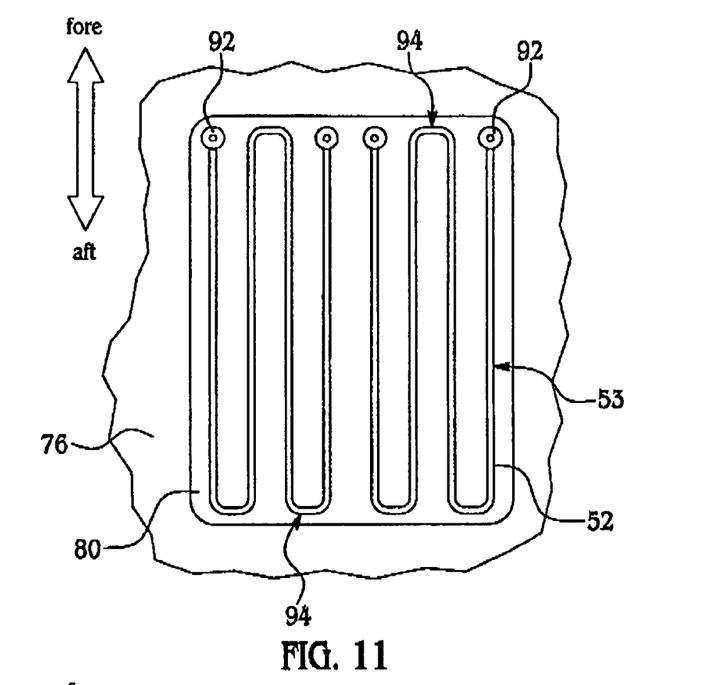
FIG. 11 is a plan view illustrating one embodiment of a condenser coil.

The carbon foam layer 80 may be machined to match a desired exterior contour of the wing skin 24a. As best seen in FIG. 11, each of the condenser coils 52 may include multiple fluid connections 92 that connect the coil 52 to the feedline 46 and the expansion valve 56. In the embodiment illustrated in FIG. 11, the condenser coil 52 includes a series of parallel, straight tube sections or legs 52a that are connected by curved end sections 94. The longitudinal axes of the straight tube sections 52a extend in a fore and aft direction within the wing box 20. Through this fore and aft arrangement, bending stresses created by wing deflection are limited to the curved sections 94 of the coil 52.

The condenser coils 52 are disposed within slots that may be machined in the layer 80 of carbon foam and are potted in a thermally conductive potting compound 82 which may be a graphite filled potting compound, for example. The potting compound may comprise a paste exhibiting conductivity of at least about 2.5 W/m-K. For example, the paste may comprise a modified form of a paste available from the Henkel Corporation and identified by the manufacturer as Hysol® EA 9396. The thermal properties of the paste may be modified by mixing thermally conductive carbon nanotubes particles in the solution. This paste is a low viscosity, room temperature curing adhesive system with good strength properties. A portion of the condenser coils 52 contact the interior face of the outboard facesheet 76. By placing a portion of the coils 52 in contact with the facesheet 76 and using a thermally conductive potting compound 82 to fix the condenser coils 52 in position within the carbon foam 80, the thermal resistance between the condenser coils 52 and the outboard facesheet 76 is reduced. The core 78 may be a lightweight structural material such as a honeycomb formed from any of a variety of materials such as aluminum, thermoplastic or NOMEX®.

Figure 9:
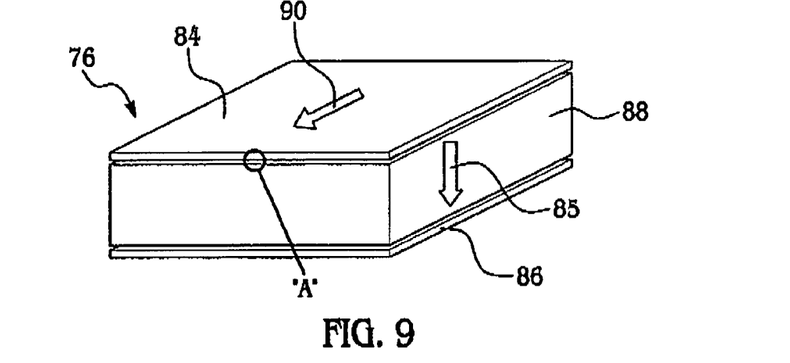
FIG. 9 is a perspective illustration of a facesheet forming part of the skin shown in FIG. 8.
Figure 10:
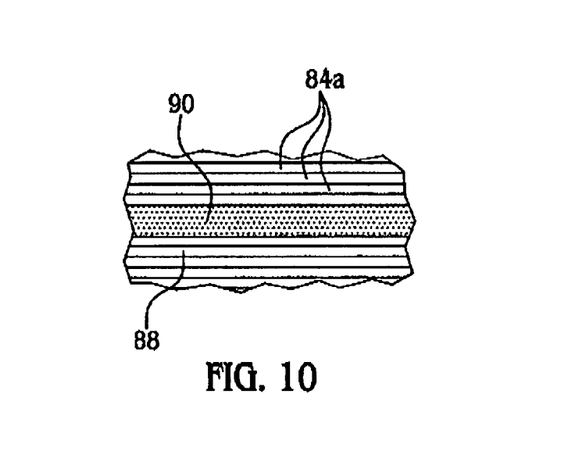
FIG. 10 is a cross sectional illustration of the area designated as "A" in FIG. 9.

The construction of the inboard and outboard facesheets 74, 76 may be, but need not be identical. In the illustrated embodiment, the outboard facesheet 76, which is exposed to free-flowing air over the wing, is a sandwiched construction, the details of which are shown in FIGS. 9 and 10. Facesheet 76 comprises a central layer of material 88 sandwiched between inner and outer layers of material 84, 86 respectively. Layer 84 may comprise a synthetic resin matrix such as epoxy reinforced with a mesh of aligned single wall nanotubes (SWNT) formed of carbon. In the illustrated example, the SWNTs are magnetically aligned in a desired direction shown by the arrow 90 so as to conduct heat unidirectionally within the layer 84. SWNTs comprise a one atom thick sheet of graphite rolled into a seamless cylinder with a diameter on the order of a nanometer. Carbon nanotubes are exceptionally strong and are good conductors of both electricity and heat.

The mesh of magnetically aligned SWNTs may be formed by forcing a suspension of carbon nanotubes through a fine mesh filter, and then subjecting the mesh to an electric or magnetic field that aligns the nanotubes in the mesh along one direction. The resulting flat sheets of meshed nanotubes, known in the art as "bucky paper", are then infused with a polymer binder such as epoxy, that forms a matrix reinforced by the carbon nanotube mesh. As shown in FIG. 10, multiple layers 84a of the bucky paper may be used to achieve a desired thickness of the facesheet 84.

The central layer 88 may comprise a polymer resin infused double wall nanotubes (DWNT), in which double wall nanotubes are arranged in a mesh and unidirectionally aligned in the direction of the arrow 85, transverse to the alignment of the nanotubes in the inboard layer 84. In other words, the DWNTs in layer 88 are aligned in the direction of the thickness of the layer 88. DWNTs comprise multiple layers of graphite rolled in upon themselves to form a double wall tubular shape. In one form, DWNTs may be arranged in concentric cylinders, forming a single wall nanotube within a larger single wall nanotube. In another form, a single sheet of graphite may be rolled in around itself to resemble a scroll. DWNTs possess properties similar to SWNTs but allow functionalization of the outer nanotube, i.e. grafting of chemical functions at the surface of the outer nanotube, while maintaining the inner nanotube pristine. DWNTs may offer performance equal or better than SWNTs for conduction and emission of electrons, and show significantly longer useful lifetimes. DWNTs are commercially available from Tailored Materials Corporation Inc. located in Tucson, Ariz. The facesheets 74, 76 may employ a resin matrix exhibiting thermal conductivities up to 5 W/m-K.

As in the case of layers 84, layer 88 may comprise multiple sheets of magnetically aligned MWNTs arranged in a mesh and infused with a polymer resin such as epoxy. The layers 84, 86 of SWNTs are bonded to the central layer 88 using a layer or film 90 of conductive adhesive material that may include carbon nanofibers.

Heat delivered by the condenser coils 52 is conducted both directly to the outer facesheet 76, and indirectly through the potting compound 82 and carbon foam layer 80 to the outer facesheet 76. Thus, the carbon foam layer 80 assists in transferring heat from almost the entire circumference of the condenser coils 52 while assisting in spreading the conducted heat over a wider area of the outboard facesheet 76. The directional nature of the SWNT layer 84 further assists in spreading the heat conducted through the carbon foam layer 80. The heat absorbed by the SWNT layer 84 is then conducted by the central DWNT layer 88 to the SWNT layer 86.

The SWNT layer 86 is magnetically aligned to thermally conduct heat across the layer 86, thereby dispersing the heat over a wider area before it is released into the air flowing over the layer 86. As a result of the use of the carbon foam layer 80 in combination with the aligned nanotube mesh in layers 84, 86 and 88, the heat released by the condenser coils 52 is spread over a wider surface area, thereby avoiding "hot spots" that may degrade performance of components and/or act as undesirable radar signatures in military applications.

Figure 12:
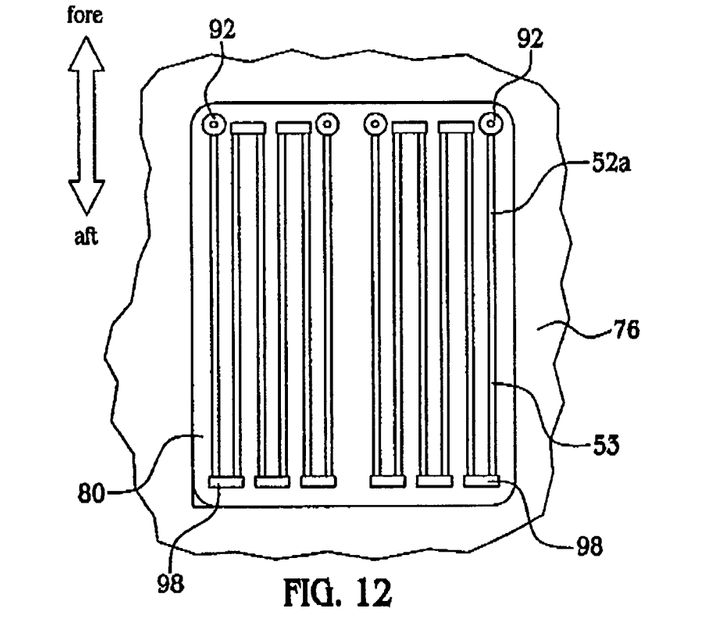
FIG. 12 is an illustration similar to FIG. 11 but showing an alternate embodiment of the condenser.

FIG. 12 illustrates an alternate form of condenser coils 52a in which the tube legs 53 are connected at their ends by fittings 98, rather than the bends 94 used in the coil 52 shown in FIG. 11. By using fittings 98 to connect adjacent tube legs 53 the total length of a coil 52 may be increased within a given area of space within the wing box 20.

Figure 13:
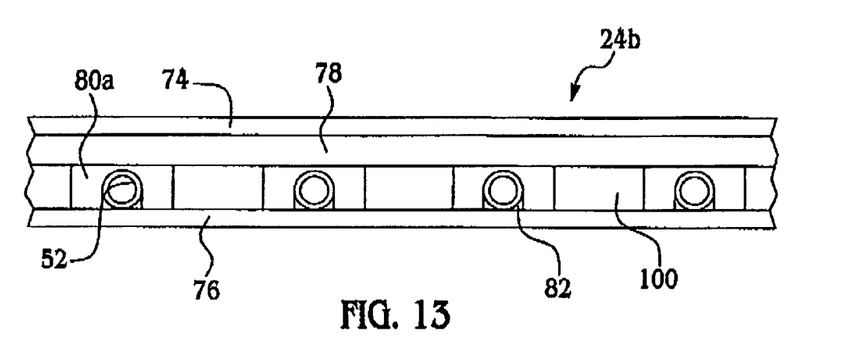
FIG. 13 is a sectional illustration of another embodiment of the wing skin.

FIG. 13 illustrates another embodiment of a skin 24b. In this embodiment, the condenser coils 52 are bonded directly to the outer facesheet 76. A conductive carbon foam strip 80a is fitted around each of the coils 52. Honeycomb cores 100 are placed between adjacent foam strips 80a. The skin construction shown in FIG. 13 may provide a reduction in weight compared with the skin 24a shown in FIG. 8.

Figure 14:
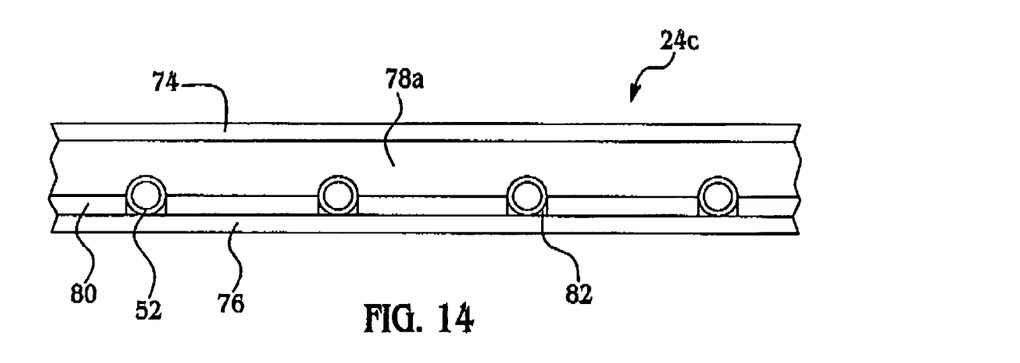
FIG. 14 is a sectional illustration of a further embodiment of the wing skin.

Another embodiment of a skin 24c is shown in FIG. 14. The honeycomb core 78a is fitted around a portion of each of the condenser coils 52. The condenser coils 52 are positioned within slots in the carbon foam layer 80 and are bonded directly to the outboard facesheet 76. The skin construction shown in FIG. 14 reduces weight as a result of the reduction in the thickness of the carbon foam layer 80, but in some cases may increase the thermal resistance between the condenser coils 52 and the outboard facesheet 76.

Figure 15:
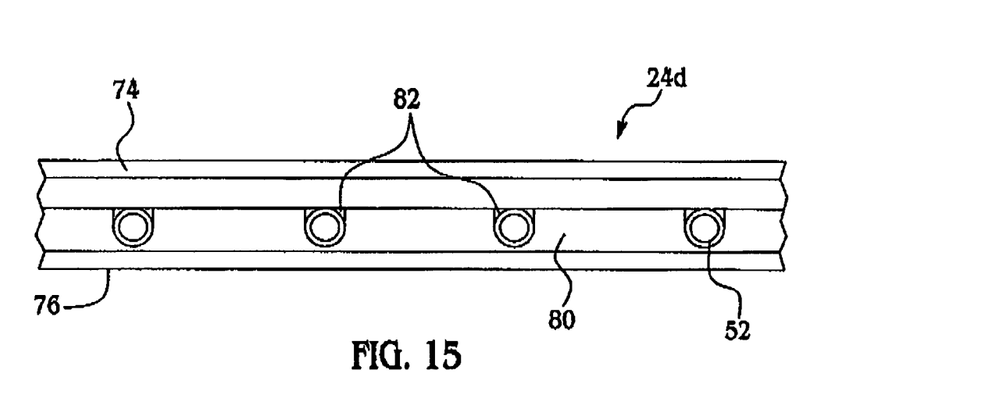
FIG. 15 is a sectional illustration of another embodiment of the wing skin.

FIG. 15 illustrates still another embodiment of a skin 24d in which the condenser coils 52 are disposed within channels in the carbon foam layer 80, and are spaced slightly from the outboard facesheet 76. In this embodiment, all of the heat removed from the condenser coils 52 must pass through the carbon foam layer 80.

Figure 16:
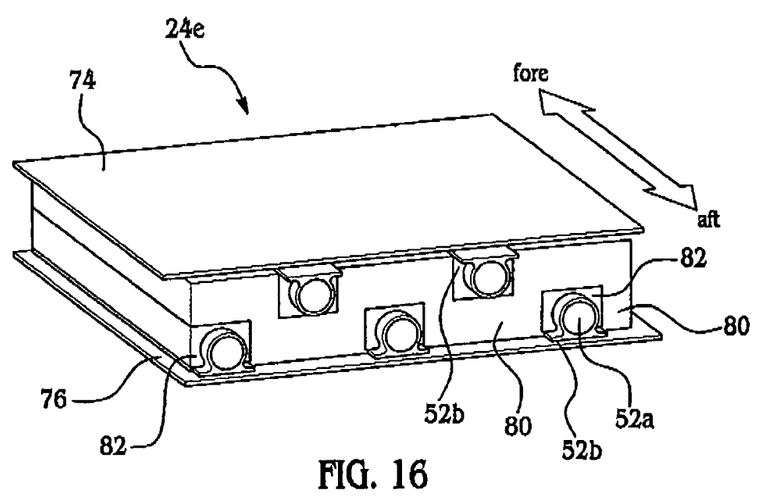
FIG. 16 is a perspective illustration of a wing skin section employing an alternate embodiment of the condensing coil.

A further embodiment of the skin 24e is illustrated in FIG. 16. The condenser coils 52a are alternately attached directly to the inboard and outboard facesheets 74, 76. The coils 52a each include a flange 52b which provides an increased area of contact with the corresponding facesheet 74, 76. The coils 52a are held in potting compound 82 within channels formed in a layer 80 of conductive carbon foam. In this embodiment, heat is conducted to both the inboard and outboard facesheets 74, 76. The inboard facesheets 74 may face or surround a thermal mass such as fuel within a fuel tank that may absorb the heat conducted through the inboard facesheets 74.

Figure 17:
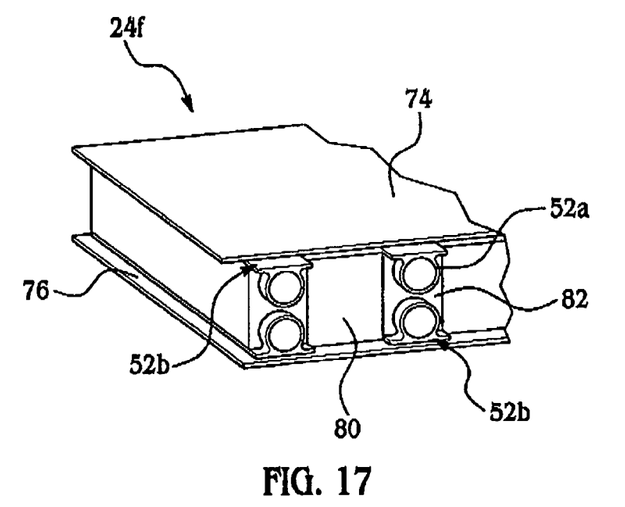
FIG. 17 is an illustration similar to FIG. 16 but showing another embodiment of the condensing coil.

Similarly, as illustrated in FIG. 17, in another embodiment of the skin 24f, the condenser coils 52a may be vertically stacked in pairs and held within a potting compound 82 that is separated by strips of carbon foam 80.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A composite skin for an aerospace vehicle, comprising:
   a structural core, of honey comb material;
   a thermally conductive layer comprising carbon foam, adjacent to the structural core, having a channel integrally formed therein;
   a thermal distribution system, comprising at least one heat exchange coil, including a heat exchange fluid conduit disposed within the channel, adapted to distribute heat from a heat source through the composite skin; and
   first and second facesheets, disposed on opposite sides of the structural core and the thermally conductive layer, the first facesheet being thermally conductive and being disposed adjacent to the thermally conductive layer, wherein the structural core is located between the second facesheet and the thermally conductive layer.

2. The composite skin of claim 1, wherein the first facesheet includes:
   a first layer of material adapted to conduct heat laterally through the first facesheet; and
   a second layer of material, contacting the first layer, adapted to conduct heat through the thickness of the first facesheet.

3. The composite skin of claim 2, wherein the first facesheet includes a layer of thermally conductive adhesive bonding the first layer to the second layer.

4. The composite skin of claim 2, wherein the first facesheet further comprises a third layer of material, contacting the second layer, the third layer adapted to conduct heat laterally through the first facesheet.

5. The composite skin of claim 2, wherein the first layer of material includes a mesh of carbon nanotubes, aligned in one direction within the first facesheet and held in a synthetic resin matrix.

6. The composite skin of claim 1, wherein each of the first and second facesheets includes:
   a first layer, including a mesh of single wall carbon nanotubes aligned in a first direction within the facesheet and held in a synthetic resin matrix; and
   a second layer, contacting the first layer, the second layer including a mesh of double wall carbon nanotubes aligned in a second direction transverse to the first direction and held in a synthetic resin matrix.

7. The composite skin of claim 1, wherein the first facesheet includes:
   first and second layers, each including synthetic resin reinforced with single wall carbon nanotubes unidirectionally aligned; and
   a third layer, including synthetic resin between the first and second layers, the third layer being reinforced with double wall nanotubes aligned in a direction transverse to each of the alignment directions of the single wall nanotubes in the first and second layers.

8. The composite skin of claim 7, wherein the first facesheet includes:
   a first thermally conductive film, containing carbon nanofibers, bonding the first layer to the second layer; and
   a second thermally conductive film, containing carbon nanofibers, bonding the second layer to the third layer.

9. The composite skin of claim 1, wherein the heat exchange fluid conduit includes a series of straight tube sections having longitudinal axes that are generally parallel to each other.

10. The composite skin of claim 1, wherein the heat exchange fluid conduit is in thermal contact with at least one of the first and second facesheets.

11. The composite skin of claim 1, further comprising a thermally conductive potting compound, contacting the heat exchange fluid conduit within the channel.

12. The composite skin of claim 1, wherein the channel extends at least partially into a thickness of the structural core.

13. The composite skin of claim 1, wherein the thermally conductive layer comprises a conductive carbon foam strip, fitted around at least a portion of the heat exchange fluid conduit.

14. The composite skin of claim 1, wherein a portion of the thermally conductive layer is disposed between the heat exchange coil and the nearest adjacent facesheet.

15. The composite skin of claim 1, wherein the heat exchange fluid conduit includes portions that are positioned adjacent to each of the first and second facesheets, respectively.

16. The composite skin of claim 1, further comprising a flange, disposed between at least a portion of the heat exchange fluid conduit and an adjacent facesheet, the flange providing an increased area of contact with the adjacent facesheet.

17. The composite skin of claim 1, wherein the carbon foam has a thermal conductivity of at least 40 W/mK.

18. The composite skin of claim 1, wherein the structural core comprises an aluminum honeycomb material.

* * * * *